(12) United States Patent  
Lin

(10) Patent No.: US 9,362,254 B1  
(45) Date of Patent: Jun. 7, 2016

(54) WIRE BONDING METHOD AND CHIP STRUCTURE

(71) Applicant: NANYA TECHNOLOGY CORPORATION, Taoyuan (TW)

(72) Inventor: Po-Chun Lin, Changhua County (TW)

(73) Assignee: NANYA TECHNOLOGY CORPORATION, Taoyuan (TW)

(*) Notice: Subject to any disclaimer, the term of this patent is extended or adjusted under 35 U.S.C. 154(b) by 0 days.

(21) Appl. No.: 14/620,947

(22) Filed: Feb. 12, 2015

(51) Int. Cl.
*H01L 23/52* (2006.01)
*H01L 23/00* (2006.01)
*B23K 1/00* (2006.01)

(52) U.S. Cl.
CPC .............. *H01L 24/85* (2013.01); *B23K 1/0016* (2013.01); *H01L 24/49* (2013.01); *H01L 2224/4909* (2013.01); *H01L 2224/8503* (2013.01); *H01L 2924/37001* (2013.01)

(58) Field of Classification Search
CPC ......... H01L 24/10; H01L 24/49; H01L 24/85; H01L 2224/4909; H01L 2224/8503; H01L 2924/386

USPC .................. 257/777, E25.006, 780–782, 784, 257/E23.001–E23.194, E0.024, E23.033
See application file for complete search history.

(56) References Cited

U.S. PATENT DOCUMENTS 7,021,520 B2 * 4/2006 Bowen ................. B23K 20/007
  228/180.5
8,952,549 B2 * 2/2015 Kim .................... H01L 25/0657
  257/777

* cited by examiner

*Primary Examiner* — Jasmine Clark
(74) *Attorney, Agent, or Firm* — J.C. Patents

(57) ABSTRACT

A wire bonding method includes the following steps. First, a substrate including at least one metal finger is provided. Next, a first chip including at least one first boding pad is disposed on the substrate. Next, a metal ball bump is formed on the corresponding metal finger. Next, a first wire is formed from the metal ball bump toward the corresponding first boding pad. Next, a first free air ball is formed on the first wire by electronic flame-off process. Then, the first free air ball connected to the first wire is pressed on the corresponding first boding pad, such that the first wire is located between the first free air ball and the corresponding first boding pad. A package structure using the wire bonding method is also provided.

7 Claims, 6 Drawing Sheets

WIRE BONDING METHOD AND CHIP STRUCTURE

BACKGROUND OF THE INVENTION

1. Field of the Invention

The present invention generally relates to a wire bonding method and a chip structure. More particularly, the present invention relates to a wire bonding method and a chip structure using the same.

2. Description of Related Art

Modern electronic equipment relies heavily on printed circuit boards on which semiconductor chips, or integrated circuits (ICs), are mounted. The mechanical and electrical connections between the chip and the substrate have posed challenges for chip designers. Wire bonding is one of the well known techniques for interconnecting the IC to the substrate.

In general, wire bonding technique includes "forward bonding" and "reversed bonding". Forward bonding refers to bonding from an integrated circuit/component down to a substrate. A forward bonding process places a ball bond on the die first, a capillary then forms a stitch bond from the ball bond to a pad of the substrate. Most wire bonding applications use the typical forward bonding process, because it is faster and more capable of finer pitch than reverse bonding. However, forward bonding has a loop height constraint due to the neck area above the ball. Excessive bending above the ball can cause neck cracks, which results in reliability problems. Therefore, the chip structure using forward bonding process is hard to meet the requirements of low-profile looping.

A reverse bonding process or so called Stitch-bond Stands on Bump (SSB), on the contrary, places a bump on the die pad first. After the bump is formed, a ball bond is placed on the substrate, followed by a stitch bond on the bump. With this metal ball bump on the pad of chip, it can create buffer to keep the high down force of stitch bond from damaging the underlayer structures beneath the pad. Low-profile looping requirements have propelled the growing use of reverse ball bonding. However, reverse bonding is a discontinuous process which is a much slower process than forward bonding. Therefore, how to meet the low-profile looping requirements but also keep efficient in manufacture is an important research topic in current industry.

SUMMARY OF THE INVENTION

Accordingly, the present invention is directed to a wire bonding method which has simple process and is more efficient, and the chip structure using the wire bonding method can meet the low-profile looping requirements.

The present invention is further directed to a chip structure which meets the low-profile looping requirements and is more efficient in manufacture.

The present invention provides a wire bonding method including the following steps. First, a substrate including at least one metal finger is provided. Next, a first chip including at least one first boding pad is disposed on the substrate. Next, a metal ball bump is formed on the corresponding metal finger. Next, a first wire is formed from the metal ball bump toward the corresponding first boding pad. Next, a first free air ball is formed on the first wire by electronic flame-off process. Then, the first free air ball connected to the first wire is pressed on the corresponding first boding pad, such that the first wire is located between the first free air ball and the corresponding first boding pad.

The present invention provides a package structure. The package structure includes a substrate, a first chip, at least one metal ball bump, at least one first wire and at least one first free air ball after bonded. The substrate includes a first surface and at least one metal finger disposed on the first surface. The first chip is disposed on the first surface and includes a first active surface and at least one first boding pad disposed on the first active surface. The metal ball bump is disposed on the corresponding metal finger respectively. The first wire is connected between the corresponding metal finger and the corresponding first boding pad respectively. The first free air ball is connected to the corresponding first wire and disposed on the corresponding first boding pad respectively, such that the first wire is located between the corresponding first free air ball and the corresponding first boding pad.

According to an embodiment of the present invention, the first wire is formed by a capillary of a wire-bonding apparatus moving from the metal finger toward the corresponding first boding pad.

According to an embodiment of the present invention, the electronic flame-off process further includes the following steps: an electronic flame-off wand is placed with a predetermined distance from the first wire to create an electrical arc between the electronic flame-off wand electrode and the first wire.

According to an embodiment of the present invention, the first wire and the first free air ball are integrally formed.

According to an embodiment of the present invention, the wire bonding method further includes the following steps: a second chip is stacked on the first chip, and the second chip exposes the first boding pad and includes at least one second boding pad.

According to an embodiment of the present invention, the wire bonding method further includes the following steps: after the first free air ball is pressed on the corresponding first boding pad, a second wire is formed from the corresponding first boding pad toward the corresponding second boding pad. Next, a second free air ball is formed on the second wire by electronic flame-off process. Next, the second free air ball connecting the second wire is pressed onto the corresponding second boding pad, such that the second wire is located between the second free air ball and the corresponding second boding pad.

According to an embodiment of the present invention, the second wire is formed by a capillary of a wire-bonding apparatus moving from the corresponding first bond pad toward the corresponding second boding pad.

According to an embodiment of the present invention, the electronic flame-off process further includes the following steps: an electronic flame-off wand is placed with a predetermined distance from the first wire to create an electrical arc between the electronic flame-off wand and the second wire.

According to an embodiment of the present invention, the first free air ball and the second wire are continuously and integrally formed.

According to an embodiment of the present invention, the second wire and the second free air ball are integrally formed.

According to an embodiment of the present invention, the distance from the first active surface to the highest point of the first wire ranges from a diameter of the first wire to 200 μm.

According to an embodiment of the present invention, the distance from the second active surface to the highest point of the second wire ranges from a diameter of the second wire to 200 μm.

Based on the aforementioned description, the free air ball is formed on the wire by electronic flame-off process and then pressed onto the bond pad, such that the wire is located between the free air ball and the bond pad. With the wire bonding method described above, the wire boding of the chip structure can be performed continuously without having to place a bump on the bond pad first, and then place a metal ball bump on the metal finger of substrate. Therefore, manufacturing process of the chip structure can be simplified, so as to speed up the wire bonding process of the chip structure.

In addition, since the highest point of the wire loop is adjacent to the first bond, the wire bonding method of the present invention set the first bond to be the lower bonding surface, so as to reduce the overall height of the wire loop. Moreover, since the wire is located between the free air ball and the bond pad instead of being disposed on top of the free air ball, the overall height of the wire loop of the chip structure can be further reduced. Therefore, the wire bonding method and the chip structure using the same not only can meet the low-profile requirements, but also can improve the efficiency of the wire bonding process.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
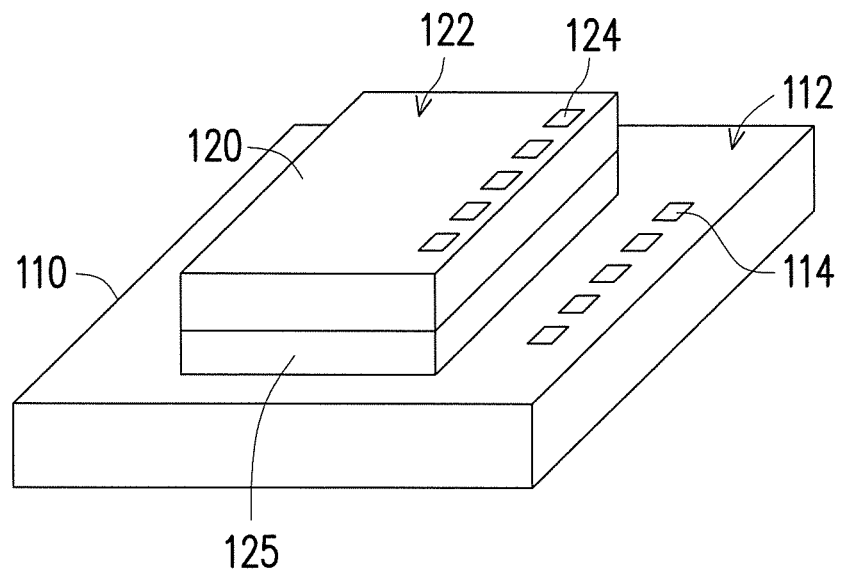
FIG. 1A to FIG. 1H are schematic views illustrating a wire bonding process according to an exemplary embodiment.

Reference will now be made in detail to the present preferred embodiments of the invention, examples of which are illustrated in the accompanying drawings. Wherever possible, the same reference numbers are used in the drawings and the description to refer to the same or like parts.

In the following detailed description of the preferred embodiments, reference is made to the accompanying drawings which form a part hereof, and in which are shown by way of illustration specific embodiments in which the invention may be practiced. In this regard, directional terminology, such as "top", "bottom", "front", "back", etc., is used with reference to the orientation of the Figure(s) being described. The components of the invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the invention. Also, it is to be understood that the phraseology and terminology used herein are for the purpose of description and should not be regarded as limiting. The use of "including", "comprising", or "having" and variations thereof herein is meant to encompass the items listed thereafter and equivalents thereof as well as additional items. Unless limited otherwise, the terms "connected", "coupled", and "mounted" and variations thereof herein are used broadly and encompass direct and indirect connections, couplings, and mountings. Accordingly, the drawings and descriptions will be regarded as illustrative in nature and not as restrictive.

FIG. 1A to FIG. 1H are schematic cross-sectional views illustrating a wire bonding process according to an exemplary embodiment. In the present embodiment, the wire bonding method includes the following steps. Firstly, referring to FIG. 1A, a substrate 110 is provided. The substrate 110 may include a first surface 112 and at least one metal finger 114. It is noted that a plurality of metal fingers 114 are illustrated in the present embodiment, but the invention is not limited thereto. The metal fingers 114 are disposed on the first surface 112. Also, a first chip 120 is disposed on the substrate 110. In the present embodiment, the first chip 120 is attached to the substrate 110 via an adhesive material 125, but, of course, the present invention is not limited thereto. The first chip 120 may include a first active surface 122 and at least one first boding pad 124. It is noted that a plurality of first boding pads 124 are illustrated in the present embodiment, but the invention is not limited thereto. The first boding pads 124 are disposed on the first active surface 122. Of course, the present embodiment is merely for illustration. In other embodiment, another chip can be further stacked on the first chip 120. The present invention does not limit the number of the chips stacked on the substrate 110.

Figure 1B:
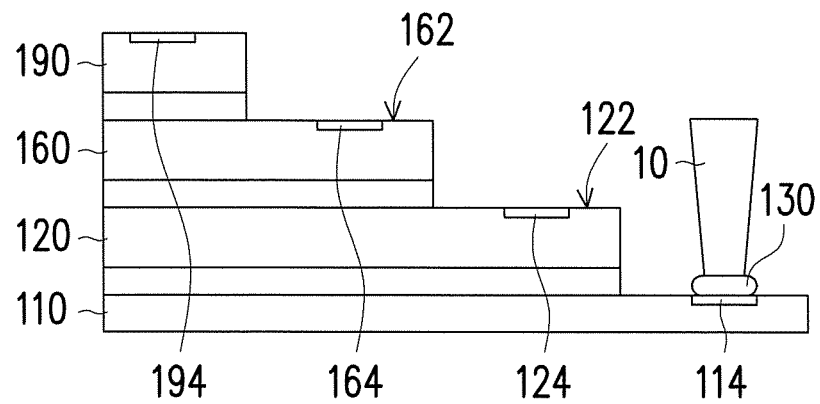

Referring to FIG. 1B, in the present embodiment, a second chip 160 is stacked on the first chip 120, and a third chip 190 is stacked on the second chip 160. The second chip 160 exposes the first boding pads 124 and includes a second active surface 162 and at least one second boding pad 164 disposed on the second active surface 162. The third chip 190 exposes the first boding pads 124, second bonding pads 164, and includes at least one third boding pad 194. Then, metal ball bump 130 is bonded on one of the metal fingers 114 of the substrate 110. The metal ball bump 130 can be bonded on the metal fingers 114 by, for example, thermal and ultrasonic energy, etc. The present invention is not limited thereto.

Figure 1C:
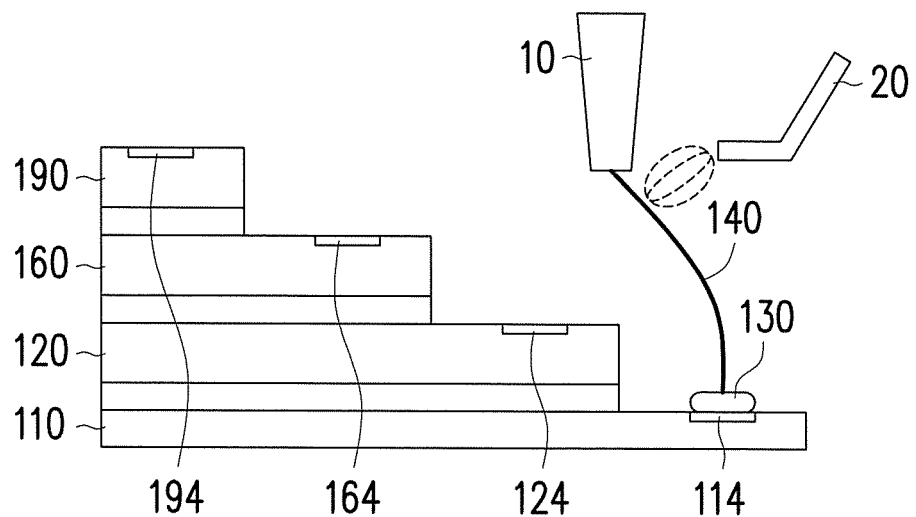
Figure 1D:
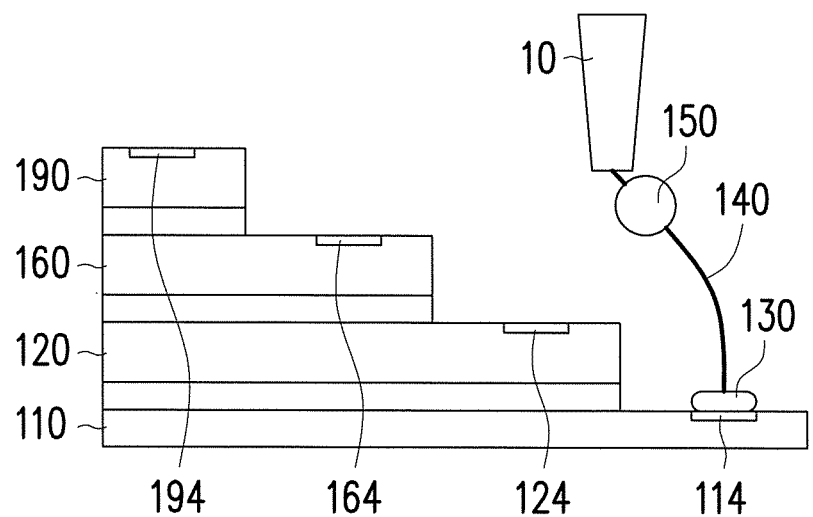

Referring to FIG. 1C and FIG. 1D, a first wire 140 is formed from the metal ball bump 130 toward one of the first boding pads 124. In detail, the capillary 10 of the wire-bonding apparatus travels from the metal ball bump 130 to the first boding pads 124 to form the first wire 140. Then, a first free air ball 150 is formed on the first wire 140 by electronic flame-off process (EFO). The processes will be described in more detail below.

Figure 2:
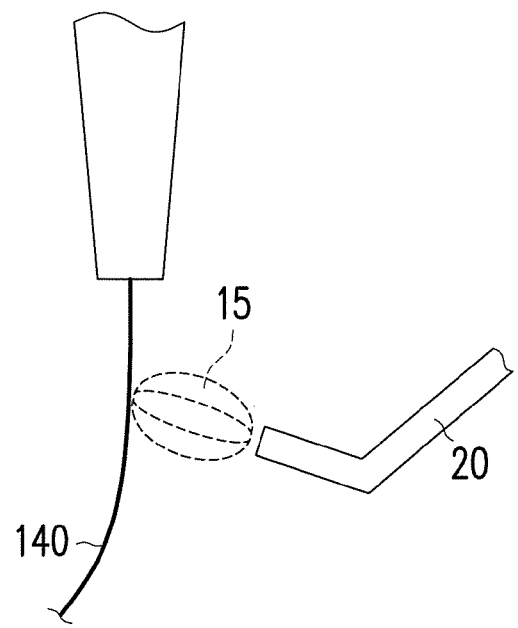
FIG. 2 to FIG. 3 are schematic views illustrating a process of forming a free air ball on a wire according to an exemplary embodiment.
Figure 3:
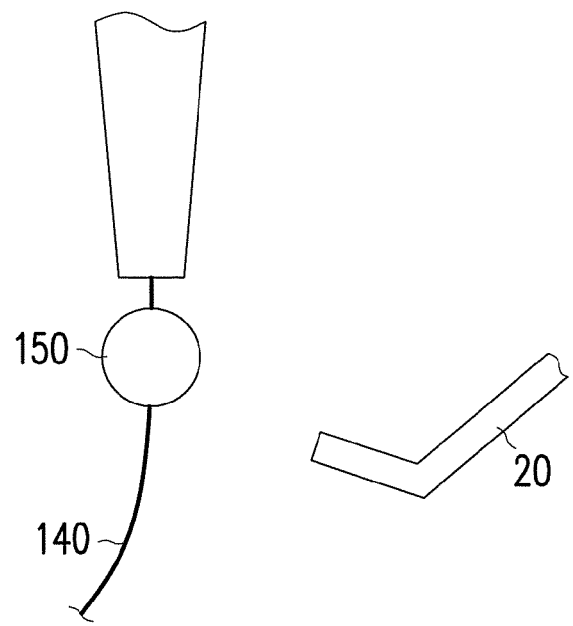

FIG. 2 to FIG. 3 are schematic views illustrating a process of forming a free air ball on a wire according to an exemplary embodiment. Referring to FIG. 2 and FIG. 3, the first free air ball 150 formation process is achieved by ionization of an air gap by electronic flame-off (EFO) process. In EFO process, electric heating discharge occurs between two electrodes: one electrode may be the first wire 140, typically copper or gold (anode) and the other electrode may be an electrical flame-off (EFO) wand 20 (cathode). To be more specific, the first free air ball 150 is formed by placing an electrical flame-off (EFO) wand 20 a predetermined distance from the first wire 140 as shown in FIG. 2, such that an electrical arc 15 is formed between the first wire 140 and the EFO wand 20. Accordingly, the heat produced by an EFO wand 20 during the discharge causes the first wire 140 to melt and surface tension of the molten metal causes the metal to roll up into a ball shape. When a sufficient amount of the metal (i.e. first wire 140) has melted, the discharge is terminated so as to form the first free air ball 150 on the first wire 140 as shown in FIG. 3. As such, the first wire 140 and the first free air ball 150 are integrally formed. By varying the intensity and the duration of the electrical arc, the size of the first free air ball 150 that is formed can be adjusted to specific dimensions.

Figure 1E:
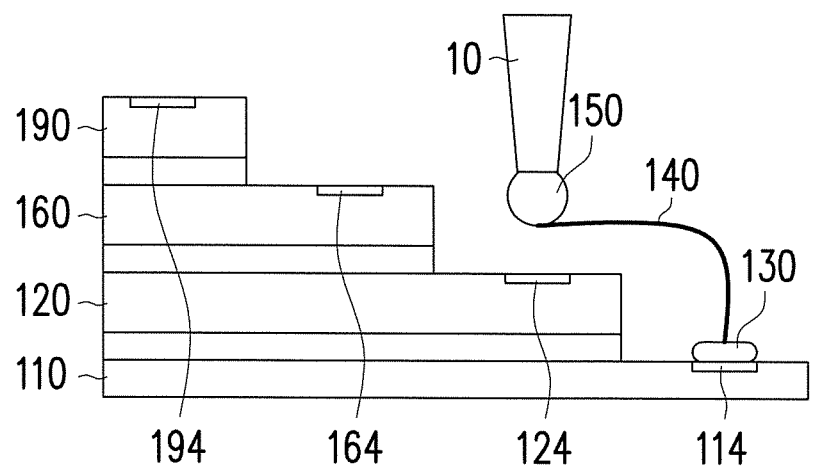
Figure 1F:
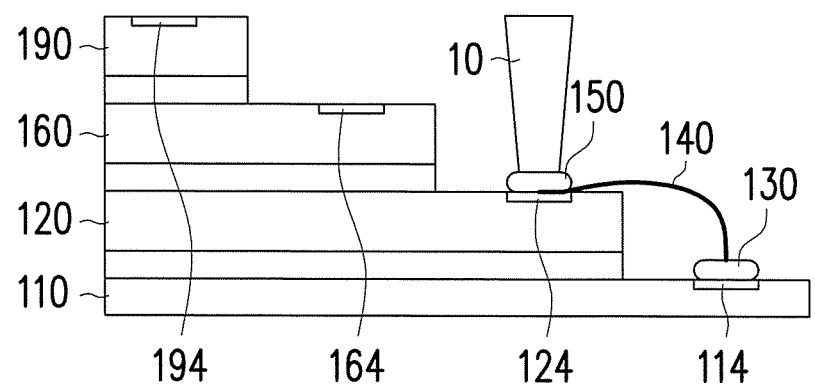

Referring to FIG. 1E and FIG. 1F, the first free air ball 150 connected to the first wire 140 is then pressed onto one of the first boding pads 124 to form a ball bump on the first boding pads 124, such that the first wire 140 is located between the first free air ball 150 and the one of the first boding pads 124.

Figure 1G:
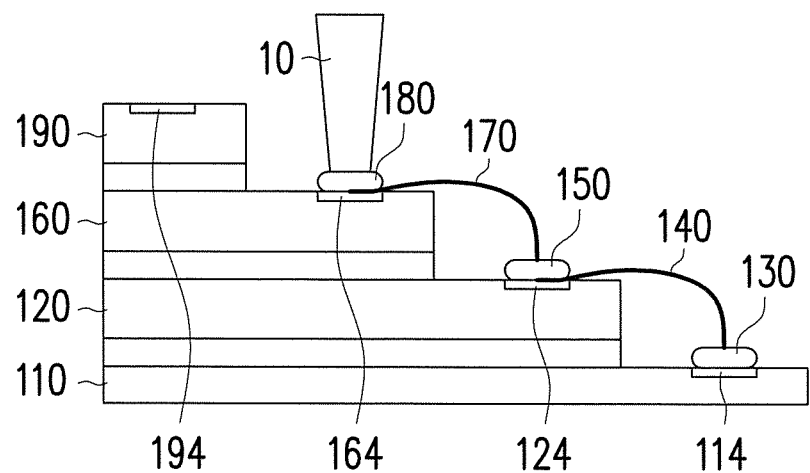
Figure 1H:
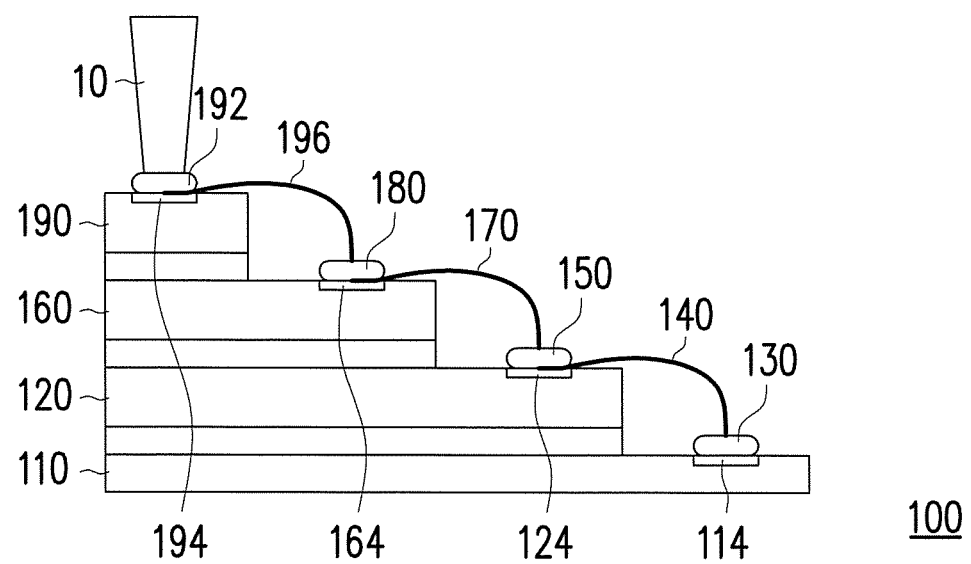

Then, the steps shown in FIG. 1C to FIG. 1F can be repeated to continuously wire bond the second chip 160 and the third chip 190. In detail, referring to FIG. 1G, a second wire 170 is formed from the abovementioned first boding pad 124 toward one of the second boding pads 164. To be more specific, the capillary 10 travels from the first boding pad 124 toward the second boding pad 164 as shown in FIG. 1G to form the second wire 170. Next, a second free air ball 180 is formed on the second wire 170 by the same electronic flame-off process described above. Then, the second free air ball 180 connecting the second wire 170 is pressed onto the second boding pad 164, such that the second wire 170 is located between the second free air ball 180 and the second boding pad 164. Referring to FIG. 1H, with similar process, a third free air ball 192 connecting the second wire 196 is formed on the third boding pad 194, such that the third wire 196 is located between the third free air ball 192 and the third boding pad 194. As such, the first free air ball 150 and the second wire 170 are continuously and integrally formed, and the second wire 170 and the second free air ball 180 are integrally formed.

Figure 4:
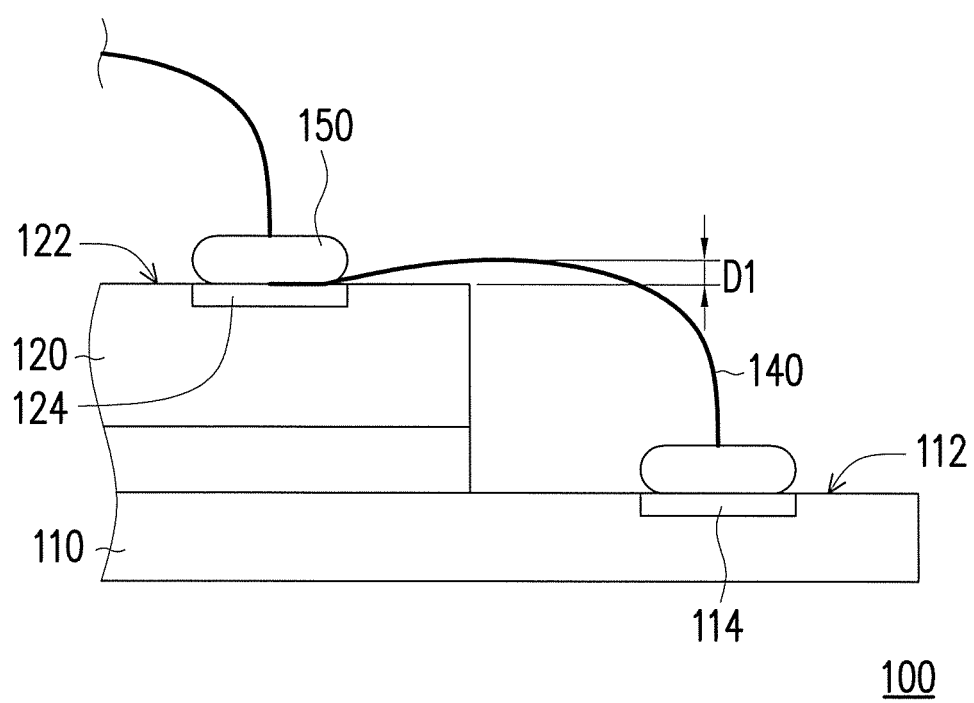
FIG. 4 is schematic partial-enlarged view of the chip structure in FIG. 1F according to an exemplary embodiment.

FIG. 4 is schematic partial-enlarged view of the chip structure in FIG. 1E according to an exemplary embodiment. Referring to FIG. 1H and FIG. 4, with the wire bonding method described above, a package structure 100 as shown in FIG. 1H and FIG. 4 can be formed. In the present embodiment, the package structure 100 includes a substrate 110, a first chip 120, at least one metal ball bump 130, at least one first wire 140 and at least one first free air ball 150. The substrate 110 includes a first surface 112 and at least one metal finger 114 disposed on the first surface 112. The first chip 120 is disposed on the first surface 112 and includes a first active surface 122 and at least one first boding pad 124 disposed on the first active surface 122. The metal ball bump 130 is disposed on the corresponding metal finger 114 respectively. The first wire 140 is connected between the corresponding metal ball bump 130 and the corresponding first boding pad 124 respectively. The first free air ball 150 is connected to the corresponding first wire 140 and disposed on the corresponding first boding pads 124 respectively, such that the first wire 140 is located between the corresponding first free air ball 150 and the corresponding first boding pad 124. With the disposition, since the highest point of the wire loop is adjacent to the metal ball bump 130, the overall height of the first wire 140 can thus be reduced. In the present embodiment, the distance D1 from the first active surface 122 to the highest point of each first wire 140 may range from, for example, a diameter of the first wire 140 to 200 μm.

In addition, the package structure 100 may further includes a second chip 160, at least one second wire 170 and at least one second free air ball 180. The second chip 160 as shown in FIG. 1H may be stacked on the first active surface 122 of the first chip 120 and exposing the first boding pad 124. The second chip 160 includes at least one second boding pad 164 disposed on the second active surface 162 as shown in FIG. 1B. The second wire 170 is connected between the corresponding first boding pad 124 and the corresponding second boding pad 164. The second free air ball 180 connected to the corresponding second wire 170 is disposed on the corresponding second boding pad 164 respectively, such that the second wire 170 is located between the corresponding second free air ball 180 and the corresponding second boding pad 164. The overall height of the second wire 170 can also be reduced. In the present embodiment, the distance from the second active surface 162 to the highest point of the second wire 170 may range from, for example, a diameter of the second wire to 200 μm.

In sum, the free air ball is formed on the wire by electronic flame-off (EFO) process and then pressed onto the bond pad, such that the wire is located between the free air ball and the bond pad. With the wire bonding method described above, the wire boding of the chip structure can be performed continuously without having to place a bump on the bond pad first, and then place a metal ball bump on the substrate. Therefore, manufacturing process of the chip structure can be simplified, so as to speed up the wire bonding process of the chip structure.

In addition, since the highest point of the wire loop is adjacent to the first bond, the wire bonding method of the present invention set the first bond to be the lower bonding surface, so as to reduce the overall height of the wire loop. Moreover, since the wire is located between the free air ball and the bond pad instead of being disposed on top of the free air ball, the overall height of the wire loop of the chip structure can be further reduced. Therefore, the wire bonding method and the chip structure using the same not only can meet the low-profile requirements, but also can improve the efficiency of the wire bonding process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A package structure, comprising:
   a substrate comprising a first surface and at least one metal finger disposed on the first surface;
   a first chip disposed on the first surface and comprising a first active surface and at least one first bonding pad disposed on the first active surface;
   at least one metal ball bump disposed on the corresponding metal finger respectively;
   at least one first wire connected between the corresponding metal ball bump and the corresponding first bonding pads respectively; and
   at least one first free air ball connected to the corresponding first wire and disposed on the corresponding first bonding pad respectively, such that the first wire is located between the corresponding first free air ball and the corresponding first bonding pad, wherein the first wire and the first free air ball connecting thereto are integrally formed.

2. The package structure as claimed in claim 1, wherein the distance from the first active surface to the highest point of the first wire ranges from a diameter of the first wire to 200 μm.

3. The package structure as claimed in claim 1, further comprising:
   a second chip stacked on the first active surface of the first chip and exposing the first bonding pad, the second chip comprising a second active surface and at least one second bonding pad disposed on the second active surface.

4. The package structure as claimed in claim 3, further comprising:
   at least one second wire connected between the first bonding pad and the second bonding pad respectively; and
   at least one second free air ball connected to the corresponding second wire and disposed on the corresponding second bonding pad, such that the second wire is located between the corresponding second free air ball and the corresponding second bonding pad.

5. The package structure as claimed in claim 4, wherein the first free air ball and the second wire connecting thereto are continuously and integrally formed.

6. The package structure as claimed in claim 4, wherein the second wires and the second free air ball connecting thereto are integrally formed.

7. The package structure as claimed in claim 4, wherein the distance from the second active surface to the highest point of the second wire ranges from a diameter of the first wire to 200 µm.

* * * * *